United States Patent
Cho et al.

(10) Patent No.: US 11,509,352 B2
(45) Date of Patent: Nov. 22, 2022

(54) HIGH FREQUENCY BASED BEAMFORMING ANTENNA AND COMMUNICATION METHOD THEREFOR

(71) Applicant: Electronics and Telecommunications Research Institute, Daejeon (KR)

(72) Inventors: Young Kyun Cho, Daejeon (KR); Jung Nam Lee, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 350 days.

(21) Appl. No.: 16/548,615

(22) Filed: Aug. 22, 2019

(65) Prior Publication Data
US 2020/0169291 A1   May 28, 2020

(30) Foreign Application Priority Data
Nov. 27, 2018 (KR) .................. 10-2018-0147917

(51) Int. Cl.
| H04B 3/52 | (2006.01) |
| H04B 7/06 | (2006.01) |
| H01P 3/16 | (2006.01) |
| H01L 23/66 | (2006.01) |
| H01Q 21/06 | (2006.01) |
| H01Q 21/00 | (2006.01) |
| H01Q 3/36 | (2006.01) |
| H01Q 1/38 | (2006.01) |

(52) U.S. Cl.
CPC ............ *H04B 3/52* (2013.01); *H01L 23/66* (2013.01); *H01P 3/16* (2013.01); *H01Q 1/38* (2013.01); *H01Q 3/36* (2013.01); *H01Q 21/0037* (2013.01); *H01Q 21/065* (2013.01); *H04B 7/0617* (2013.01)

(58) Field of Classification Search
CPC .......... H04B 3/52; H04B 7/0617; H01P 3/16; H01L 23/66; H01L 2223/6677; H01L 2223/6627; H01Q 21/065; H01Q 21/0037; H01Q 3/36; H01Q 1/38; H01Q 21/20; H01Q 1/2283; H01Q 21/062; H01Q 3/26
See application file for complete search history.

(56) References Cited

U.S. PATENT DOCUMENTS

| 8,378,469 B2 | 2/2013 | Gaucher et al. |
| 9,444,140 B2 | 9/2016 | Maltsev et al. |
| 9,935,065 B1 | 4/2018 | Baheti et al. |
| 10,014,566 B2* | 7/2018 | Takeda ..................... H04B 3/02 |
| 2012/0235881 A1 | 9/2012 | Pan et al. |

(Continued)

FOREIGN PATENT DOCUMENTS

| JP | 2017121011 A | 7/2017 |
| KR | 1020160080037 A | 7/2016 |

*Primary Examiner* — Minh D A
(74) *Attorney, Agent, or Firm* — William Park & Associates Ltd.

(57) ABSTRACT

A method for transmitting signals using a high frequency based integrated circuit beamforming antenna is disclosed. The method may comprise transferring an output signal of a radio frequency (RF) module to an RF transceiving unit; transferring an output signal of the RF transceiving unit to a signal converting unit including a feeding pillar; and transferring a wave signal from the signal converting unit to a traveling wave antenna unit, and the feeding pillar may convert the output signal of the RF transceiving unit to the wave signal.

14 Claims, 6 Drawing Sheets

(56) References Cited

U.S. PATENT DOCUMENTS

| | | | |
|---|---|---|---|
| 2016/0049731 A1* | 2/2016 | Yamamoto | H01Q 1/2208 |
| | | | 343/905 |
| 2016/0190707 A1 | 6/2016 | Park et al. | |
| 2016/0191133 A1 | 6/2016 | Noh et al. | |
| 2017/0346506 A1* | 11/2017 | Perumana | H04B 1/0458 |
| 2018/0059327 A1* | 3/2018 | Sakamoto | G02F 1/035 |
| 2018/0205134 A1 | 7/2018 | Khan et al. | |
| 2018/0226367 A1* | 8/2018 | Babcock | H03F 1/347 |
| 2018/0267161 A1 | 9/2018 | Nagaishi et al. | |

* cited by examiner

HIGH FREQUENCY BASED BEAMFORMING ANTENNA AND COMMUNICATION METHOD THEREFOR

CROSS-REFERENCE TO RELATED APPLICATIONS

This application claims priority to Korean Patent Application No. 10-2018-0147917 filed on Nov. 27, 2018 in the Korean Intellectual Property Office (KIPO), the entire contents of which are hereby incorporated by reference.

BACKGROUND

1. Technical Field

The present disclosure relates to a structure of a super high frequency (SHF) or extremely high frequency (EHF) antenna and a communication method using the same, and more particularly, to an integrated-circuit millimeter wave and terahertz beaming antenna and a communication method using the same.

2. Related Art

The fifth generation mobile communication aiming at Gbps (giga bps) class support, which is at least 10 to 100 times higher data rate than that of 4th generation mobile communication, is expected to be implemented in a Giga Hertz (GHz) frequency band. Further, the sixth generation mobile communication is expected to be implemented in a frequency band of several hundred GHz (sub-terahertz). For example, the implementation in the 5 GHz to 60 GHz frequency bands is being discussed, and the corresponding frequency band corresponds to a millimeter wave wavelength band (e.g., a wavelength at 30 GHz is 10 mm).

Also, unlike the conventional 20 MHz maximum bandwidth and the single subcarrier spacing of 15 kHz, the fifth generation mobile communication system aims at supporting a wide bandwidth from 5 MHz to 400 MHz and supporting various subcarrier spacing (e.g., 30 kHz, 60 kHz, 120 kHz, or the like, which is a multiple of 15 kHz). As described above, in the fifth generation mobile communication system having characteristics that require support of various frequency bandwidths in various frequency bands, since cell coverage of a case where a frequency band of several tens of GHz is used as a carrier frequency band is reduced as compared to that of the conventional technology, a variety of cell coverage extension methods using beamforming have been actively studied.

In developing a beamforming antenna (hereinafter referred to as a 'high frequency beamforming antenna') that supports operations in a millimeter wavelength band and a terahertz wavelength band (hereinafter referred to as a 'high frequency band'), power efficiency, ease of miniaturization, stable access, and the like should be considered. Considering these characteristics, a semiconductor antenna in which a millimeter wave beamforming antenna is made as an integrated circuit is actively being developed.

However, these semiconductor antennas not only require complicated impedance matching parts for being connected with a radio frequency (RF) module, but also cause additional losses. Further, a semiconductor antenna for performing beamforming requires additional RF components such as a phase modulator.

SUMMARY

In order to solve the above-described problem, exemplary embodiments of the present disclosure provide a method for transmitting signals using an integrated circuit high frequency beamforming antenna.

In order to solve the above-described problem, exemplary embodiments of the present disclosure also provide a method for receiving signals using an integrated circuit high frequency beamforming antenna.

In order to solve the above-described problem, exemplary embodiments of the present disclosure also provide an integrated circuit high frequency beamforming antenna.

In order to achieve the objective of the present disclosure, a method for transmitting signals using a high frequency based integrated circuit beamforming antenna may comprise transferring an output signal of a radio frequency (RF) module to an RF transceiving unit; transferring an output signal of the RF transceiving unit to a signal converting unit including a feeding pillar; and transferring a wave signal from the signal converting unit to a traveling wave antenna unit, wherein the feeding pillar converts the output signal of the RF transceiving unit to the wave signal.

The RF transceiving unit may include at least one of an input/output signal line and a ground (GND) part.

The travelling wave antenna unit may include at least one of a semiconductor substrate, an upper waveguide metal, and a lower waveguide metal.

The semiconductor substrate may be directly connected to the feeding pillar of the signal converting unit or connected to the feeding pillar of the signal converting unit through at least one dielectric layer.

The travelling wave antenna unit may further include at least one semiconductor reflector for steering an output beam.

The travelling wave antenna unit may further include an antenna radiator for controlling an output gain of an output beam.

Furthermore, in order to achieve the objective of the present disclosure, a method for receiving signals using a high frequency based integrated circuit beamforming antenna may comprise transferring a signal received using a traveling wave antenna unit to a signal converting unit in form of a wave signal; and transferring the wave signal to a radio frequency (RF) transceiving unit through a feeding pillar included in the signal converting unit, wherein the feeding pillar converts the output signal of the RF transceiver to the wave signal.

The method may further comprise transferring an RF signal output from the RF transceiving unit to an RF module.

The RF transceiving unit may include at least one of an input/output signal line and a ground (GND) part.

The travelling antenna unit may include at least one of a semiconductor substrate, an upper waveguide metal, and a lower waveguide metal.

The semiconductor substrate may be directly connected to the feeding pillar of the signal converting unit or connected to the feeding pillar of the signal converting unit through at least one dielectric layer.

The travelling wave antenna unit may further include at least one semiconductor reflector for steering an output beam.

The travelling wave antenna unit may further include an antenna radiator for controlling an output gain of an output beam.

Furthermore, in order to achieve the objective of the present disclosure, a high frequency based integrated circuit beamforming antenna may comprise a radio frequency (RF) transceiving unit including at least one of an input/output signal line and a ground (GND) part; a signal converting unit including a feeding pillar; and a travelling wave antenna unit including a semiconductor substrate, wherein the feeding pillar converts the output signal of the RF transceiver to the wave signal.

The semiconductor substrate may be directly connected to the feeding pillar of the signal converting unit or connected to the feeding pillar of the signal converting unit through at least one dielectric layer.

The waveguide metal layers may be deposited on both an upper surface and a lower surface of the semiconductor substrate.

The travelling wave antenna unit may further include at least one semiconductor reflector for steering an output beam.

The at least one semiconductor reflector may be a diode reflector.

A metal of a power source of the semiconductor reflector may be different from a metal of the metal waveguide layers.

The travelling wave antenna unit may further include an antenna radiator for controlling an output gain of an output beam.

According to the exemplary embodiments of the present disclosure, the antenna unit and the RF module can be manufactured by a single process, thereby reducing cost and increasing process efficiency. Also, a signal transmission loss can be minimized by feeding an RF module output signal directly into a semiconductor antenna waveguide through an integrated circuit antenna that supports beamforming in the high frequency band. Also, the maximum reflection efficiency of the antenna and the maximized constructive interference with the existing signal can be obtained by using a semiconductor diode formed inside the semiconductor waveguide antenna.

BRIEF DESCRIPTION OF DRAWINGS

Exemplary embodiments of the present disclosure will become more apparent by describing in detail embodiments of the present disclosure with reference to the accompanying drawings, in which.

DETAILED DESCRIPTION

Figure 1:
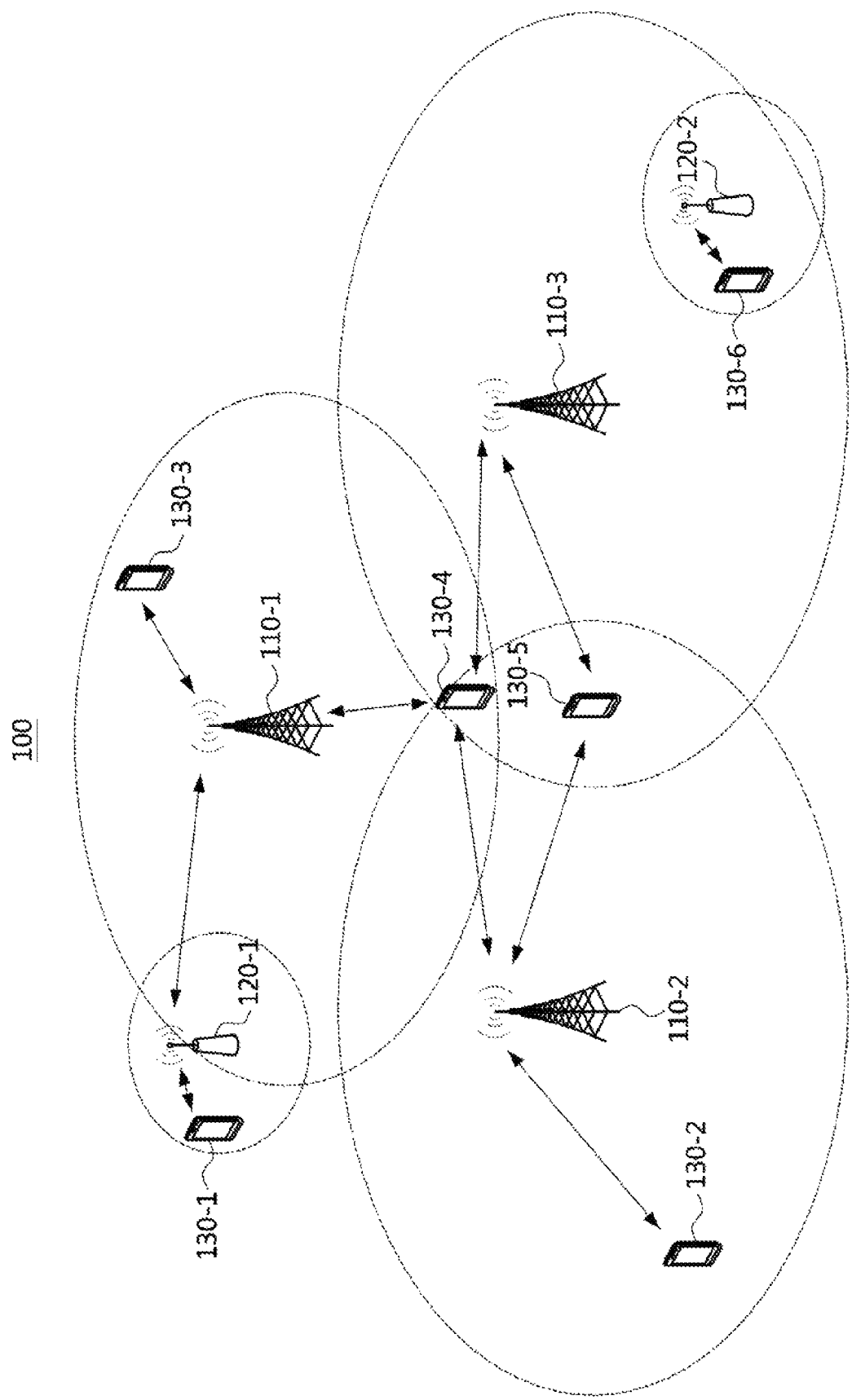
FIG. 1 is a conceptual diagram illustrating a first embodiment of a communication system.

While the present invention is susceptible to various modifications and alternative forms, specific embodiments are shown by way of example in the drawings and described in detail. It should be understood, however, that the description is not intended to limit the present invention to the specific embodiments, but, on the contrary, the present invention is to cover all modifications, equivalents, and alternatives that fall within the spirit and scope of the present invention.

Although the terms "first," "second," etc. may be used herein in reference to various elements, such elements should not be construed as limited by these terms. These terms are only used to distinguish one element from another. For example, a first element could be termed a second element, and a second element could be termed a first element, without departing from the scope of the present invention. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directed coupled" to another element, there are no intervening elements.

The terminology used herein is for the purpose of describing particular embodiments only and is not intended to be limiting of embodiments of the present invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, parts, and/or combinations thereof, but do not preclude the presence or addition of one or more other features, integers, steps, operations, elements, parts, and/or combinations thereof.

Unless otherwise defined, all terms (including technical and scientific terms) used herein have the same meaning as commonly understood by those of ordinary skill in the art to which the present invention pertains. It will be further understood that terms defined in commonly used dictionaries should be interpreted as having a meaning that is consistent with their meaning in the context of the related art and will not be interpreted in an idealized or overly formal sense unless expressly so defined herein.

Hereinafter, exemplary embodiments of the present invention will be described in greater detail with reference to the accompanying drawings. To facilitate overall understanding of the present invention, like numbers refer to like elements throughout the description of the drawings, and description of the same component will not be reiterated.

FIG. 1 is a conceptual diagram illustrating a first embodiment of a communication system.

Referring to FIG. 1, a communication system 100 may comprise a plurality of communication nodes 110-1, 110-2, 110-3, 120-1, 120-2, 130-1, 130-2, 130-3, 130-4, 130-5, and 130-6. Here, the communication system may also be referred to as a 'communication network'. Each of the plurality of communication nodes may support at least one communication protocol. For example, each of the plurality of communication nodes may support at least one communication protocol among a code division multiple access (CDMA) based communication protocol, a wideband CDMA (WCDMA) based communication protocol, a time division multiple access (TDMA) based communication protocol, a frequency division multiple access (FDMA) based communication protocol, an orthogonal frequency division multiplexing (OFDM) based communication protocol, an orthogonal frequency division multiple access (OFDMA) based communication protocol, a single carrier FDMA (SC-FDMA) based communication protocol, a nonorthogonal multiple access (NOMA) based communication protocol, and a space division multiple access (SDMA) based communication protocol. Also, each of the plurality of communication nodes may have the following structure.

Figure 2:
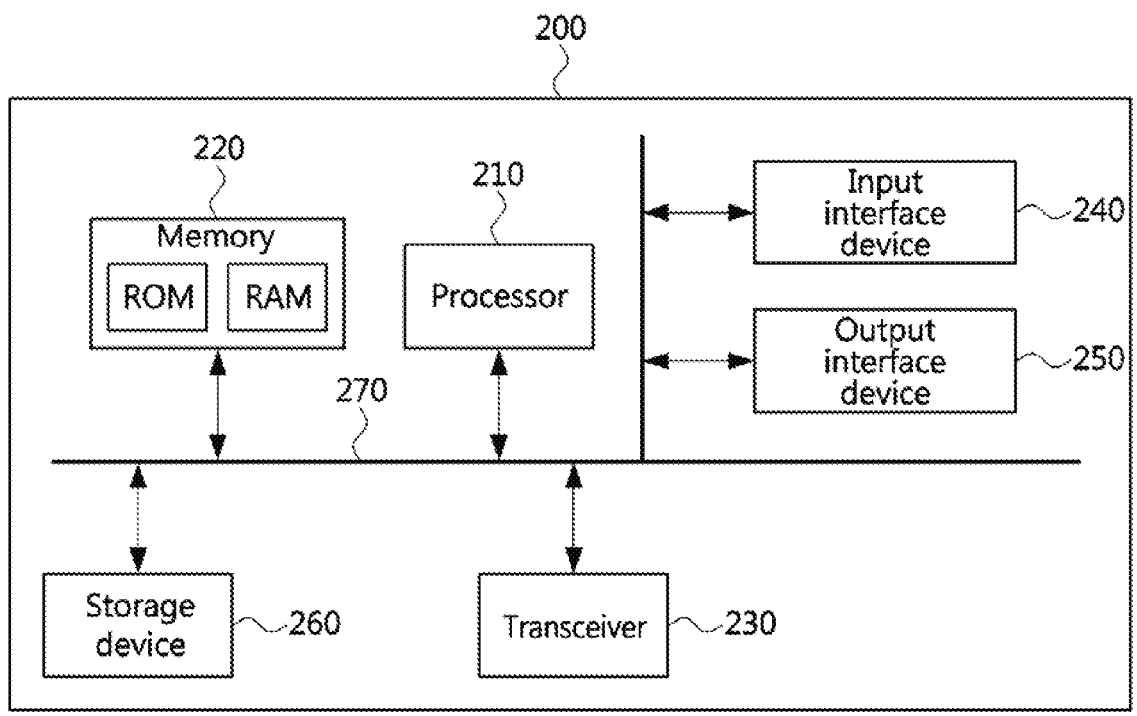
FIG. 2 is a block diagram illustrating a first embodiment of a communication node constituting a communication system.

FIG. 2 is a block diagram illustrating a first embodiment of a communication node constituting a cellular communication system.

Referring to FIG. 2, a communication node 200 may comprise at least one processor 210, a memory 220, and a transceiver 230 connected to the network for performing communications. Also, the communication node 200 may further comprise an input interface device 240, an output interface device 250, a storage device 260, and the like. Each component included in the communication node 200 may communicate with each other as connected through a bus 270. However, each component included in the communication node 200 may be connected to the processor 210 via an individual interface or a separate bus, rather than the common bus 270. For example, the processor 210 may be connected to at least one of the memory 220, the transceiver 230, the input interface device 240, the output interface device 250, and the storage device 260 via a dedicated interface.

The processor 210 may execute a program stored in at least one of the memory 220 and the storage device 260. The processor 210 may refer to a central processing unit (CPU), a graphics processing unit (GPU), or a dedicated processor on which methods in accordance with embodiments of the present disclosure are performed. Each of the memory 220 and the storage device 260 may be constituted by at least one of a volatile storage medium and a non-volatile storage medium. For example, the memory 220 may comprise at least one of read-only memory (ROM) and random access memory (RAM).

Referring again to FIG. 1, the communication system 100 may comprise a plurality of base stations 110-1, 110-2, 110-3, 120-1, and 120-2, and a plurality of terminals 130-1, 130-2, 130-3, 130-4, 130-5, and 130-6. Each of the first base station 110-1, the second base station 110-2, and the third base station 110-3 may form a macro cell, and each of the fourth base station 120-1 and the fifth base station 120-2 may form a small cell. The fourth base station 120-1, the third terminal 130-3, and the fourth terminal 130-4 may belong to cell coverage of the first base station 110-1. Also, the second terminal 130-2, the fourth terminal 130-4, and the fifth terminal 130-5 may belong to cell coverage of the second base station 110-2. Also, the fifth base station 120-2, the fourth terminal 130-4, the fifth terminal 130-5, and the sixth terminal 130-6 may belong to cell coverage of the third base station 110-3. Also, the first terminal 130-1 may belong to cell coverage of the fourth base station 120-1, and the sixth terminal 130-6 may belong to cell coverage of the fifth base station 120-2.

Here, each of the plurality of base stations 110-1, 110-2, 110-3, 120-1, and 120-2 may refer to a Node-B, a evolved Node-B (eNB), a gNB, an ng-eNB, a base transceiver station (BTS), a radio base station, a radio transceiver, an access point, an access node, a road side unit (RSU), a radio remote head (RRH), a transmission point (TP), a transmission and reception point (TRP), a flexible TRP (f-TRP), gNB, a relay node, or the like. Also, each of the plurality of terminals 130-1, 130-2, 130-3, 130-4, 130-5, and 130-6 may refer to a user equipment (UE), a terminal, an access terminal, a mobile terminal, a station, a subscriber station, a mobile station, a portable subscriber station, a node, a device, a device supporting internet of things (IoT) functions, a mounted module/device/terminal, an on-board unit (OBU), or the like.

Each of the plurality of communication nodes 110-1, 110-2, 110-3, 120-1, 120-2, 130-1, 130-2, 130-3, 130-4, 130-5, and 130-6 may support the cellular communication (e.g., long-term evolution (LTE), LTE-Advanced (LTE-A), or the like defined in the $3^{rd}$ generation partnership project (3GPP) standards). Each of the plurality of base stations 110-1, 110-2, 110-3, 120-1, and 120-2 may operate in the same frequency band or in different frequency bands. The plurality of base stations 110-1, 110-2, 110-3, 120-1, and 120-2 may be connected to each other via an ideal backhaul or a non-ideal backhaul, and exchange information with each other via the ideal or non-ideal backhaul. Also, each of the plurality of base stations 110-1, 110-2, 110-3, 120-1, and 120-2 may be connected to the core network through the ideal or non-ideal backhaul. Each of the plurality of base stations 110-1, 110-2, 110-3, 120-1, and 120-2 may transmit a signal received from the core network to the corresponding terminal 130-1, 130-2, 130-3, 130-4, 130-5, or 130-6, and transmit a signal received from the corresponding terminal 130-1, 130-2, 130-3, 130-4, 130-5, or 130-6 to the core network.

Each of the plurality of base stations 110-1, 110-2, 110-3, 120-1, and 120-2 may support OFDMA-based downlink transmissions and SC-FDMA-based uplink transmissions. Also, each of the plurality of base stations 110-1, 110-2, 110-3, 120-1, and 120-2 may support a multi-input multi-output (MIMO) transmission (e.g., a single-user MIMO (SU-MIMO), a multi-user MIMO (MU-MIMO), a massive MIMO, or the like), a coordinated multipoint (CoMP) transmission, a carrier aggregation (CA) transmission, a transmission in unlicensed band, a device-to-device (D2D) communications (or, proximity services (ProSe)), or the like. Here, each of the plurality of terminals 130-1, 130-2, 130-3, 130-4, 130-5, and 130-6 may perform operations corresponding to the operations of the plurality of base stations 110-1, 110-2, 110-3, 120-1, and 120-2 (i.e., the operations supported by the plurality of base stations 110-1, 110-2, 110-3, 120-1, and 120-2).

For example, the second base station 110-2 may transmit a signal to the fourth terminal 130-4 in the SU-MIMO manner, and the fourth terminal 130-4 may receive the signal from the second base station 110-2 in the SU-MIMO manner. Alternatively, the second base station 110-2 may transmit a signal to the fourth terminal 130-4 and fifth terminal 130-5 in the MU-MIMO manner, and the fourth terminal 130-4 and fifth terminal 130-5 may receive the signal from the second base station 110-2 in the MU-MIMO manner. The first base station 110-1, the second base station 110-2, and the third base station 110-3 may transmit a signal to the fourth terminal 130-4 in the CoMP transmission manner, and the fourth terminal 130-4 may receive the signal from the first base station 110-1, the second base station 110-2, and the third base station 110-3 in the CoMP manner. Also, each of the plurality of base stations 110-1, 110-2, 110-3, 120-1, and 120-2 may exchange signals with the corresponding terminals 130-1, 130-2, 130-3, 130-4, 130-5, or 130-6 which belongs to its cell coverage in the CA manner. Each of the base stations 110-1, 110-2, and 110-3 may control D2D communications between the fourth terminal 130-4 and the fifth terminal 130-5, and thus the fourth terminal 130-4 and the fifth terminal 130-5 may perform the D2D communications under control of the second base station 110-2 and the third base station 110-3.

Hereinafter, techniques for a beamforming antenna in form of an integrated circuit will be described. Here, even when a method (e.g., transmission or reception of a signal) to be performed in a first communication node among communication nodes is described, a corresponding second communication node may perform a method (e.g., reception or transmission of the signal) corresponding to the method performed in the first communication node. That is, when an operation of a terminal is described, a corresponding base station may perform an operation corresponding to the operation of the terminal. Conversely, when an operation of the base station is described, the corresponding terminal may perform an operation corresponding to the operation of the base station.

Also, in the present disclosure, 'high frequency' may mean a super high frequency (SHF) ranging from 3 GHz to 30 GHz or an extremely high frequency (EHF) ranging from 30 GHz to 300 GHz. Since antennas or methods according to exemplary embodiments of the present disclosure can be applied to various frequency bands including the SHF band and the EHF band, the frequency bands supported by them will be collectively referred to as 'high frequency'.

As described above, the fifth generation mobile communication (including a system and a terminal) requires higher radio capacity and performance than the conventional one. In order to meet these requirements, beamforming antennas such as a phased array antenna in a millimeter wave band are drawing attention. However, there are many difficulties in actual implementation, such as a physical antenna size, a signal loss, and antenna power consumption associated with a phased array feed.

In order to solve these problems, research on a structure of a reconfigurable antenna in form of a semiconductor integrated circuit is being actively conducted. The reconfigurable antenna is an antenna that can change a part of antenna characteristics according to need, and means an antenna that changes a center frequency, a radiation pattern, and a polarization by an electric or electronic scheme while maintaining the existing characteristics.

Such the reconfigurable antenna in the form of a semiconductor integrated circuit may control a conduction region in a silicon device channel according to a control signal. That is, a specific pattern of a silicon device may be addressed according to an ON or OFF of a switch signal to control a semi-metallic type operation of the silicon semiconductor so as to control a radiation characteristic of the antenna. Hereinafter, antennas according to exemplary embodiments of the present disclosure refer to reconfigurable antennas.

In addition, since the antenna of the semiconductor integrated circuit type structure requires a low noise figure and a low loss characteristic in a radio frequency (RF) module manufactured by a semiconductor process, a high directivity antenna of tens of dBi level is required to compensate for high attenuation in air and free space losses. Also, since a connection between the RF module and the antenna module should be designed to minimize a loss, complex matching parts such as coaxial-to-waveguide connectors are also required to be included in the integrated circuit.

In addition, in order to operate as a beamforming antenna, a component that performs a phase modulation function for performing a beamforming function should be included in the integrated circuit. Hereinafter, a high frequency based beamforming antenna structure (hereinafter referred to as a 'semiconductor high frequency beamforming antenna') in form of an integrated circuit according to an exemplary embodiment of the present disclosure, which satisfies these requirements, will be described.

Figure 3:
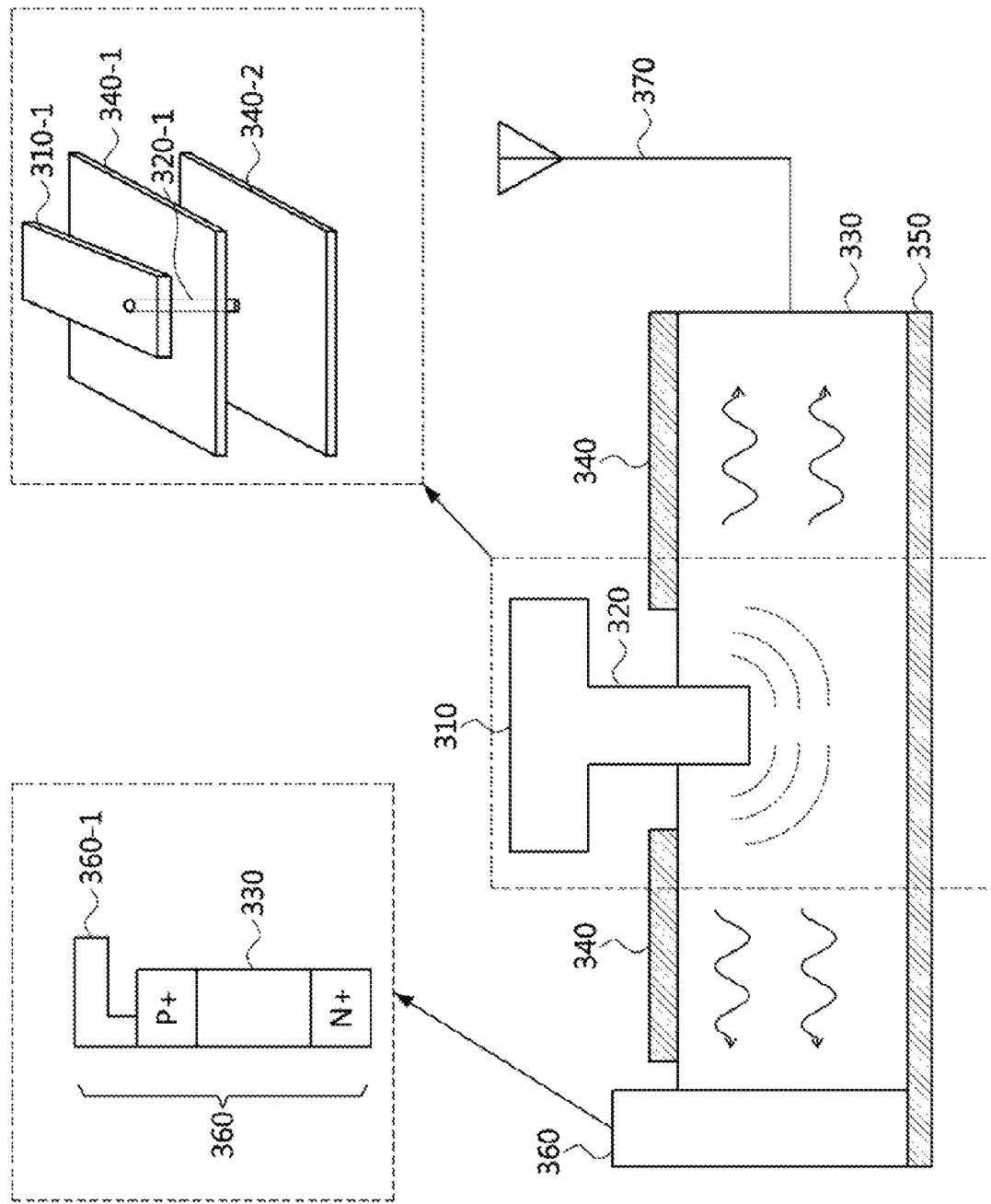
FIG. 3 is a conceptual diagram illustrating a semiconductor high frequency beamforming antenna according to an exemplary embodiment of the present disclosure.

FIG. 3 is a conceptual diagram illustrating a semiconductor high frequency beamforming antenna according to an exemplary embodiment of the present disclosure.

Referring to FIG. 3, an RF transceiving unit 310 receiving a signal from an RF module may transmit an RF signal to a signal converting unit 320 including a feeding pillar 320-1, and the feeding pillar 320-1 of the signal converting unit 320 may convert the RF signal into a wave signal and then transmit the signal through a travelling wave antenna unit 370 including a semiconductor substrate 330 surrounded by an upper waveguide metal 340 and a lower waveguide metal 350.

The RF transceiving unit 310 may perform a role of receiving a signal (referred to as an RF signal) from an RF module (not shown) and transferring the signal to the subsequent signal converting unit 320 or a role of receiving a signal from the subsequent signal converting unit 320 and transferring the signal to the RF module. The RF module in the following exemplary embodiments of the present disclosure may perform functions of a filtering unit, an amplifier unit including a low noise amplifier (LNA), an antenna switching unit, a frequency oscillation circuit unit, and an RF integrated chip (IC) processing high frequency analog signals, and the like.

The RF transceiving unit 310 may be designed in form of an input/output signal line 310-1 which is a transmission line impedance-matched with the RF module. The signal transmitted through the input/output signal line 310-1 of the RF transceiving unit 310 may be a voltage or a current signal. The thickness and/or width of the input/output signal line 310-1 of the RF transceiving unit 310 may be changed for matching with the RF module, the signal converting unit 320, and the traveling wave antenna unit 370.

Also, one or more ground (GND) lines may be disposed around the input/output signal line of the RF transceiving unit 310 to improve the noise figure and quality of the RF signal. The input/output signal line 310-1 may minimize the interference between signals by using a metal layer different from the upper waveguide metal 340, a diode bias metal 360-1 of a semiconductor reflector 360, a metal ground line, and the like, which will be described later. Further, the input/output signal line 310-1 may be designed in form of a multilayer wiring.

The signal converting unit 320 according to an exemplary embodiment of the present disclosure may include the metal feeding pillar 320-1, and may transmit the RF signal received from the input/output signal line 310-1 of the RF transceiving unit 310 to the inside of the semiconductor substrate 330 through the feeding pillar 320-1 that converts the RF signal into a wave signal of a wave form. In this case, the feeding pillar 320-1 may be directly inserted into the semiconductor substrate 330.

The RF signal may be transmitted to the signal converting unit 320 through the RF transceiving unit 310 and then to the semiconductor substrate 330 through the signal converting unit 320. Alternatively, the RF signal may be transmitted to the semiconductor substrate 330 through a coaxial-to-waveguide connector.

The feeding pillar 320-1 of the signal converting unit 320 according to an exemplary embodiment of the present disclosure may have various shapes such as a circle, a rectangle, and a triangle by using metal as a material thereof, and may perform a function of matching the characteristic impedance of the medium of the semiconductor substrate 330 to the characteristic impedance of the RF transceiving unit 310. For this, the thickness and width of the feeding pillar 320-1 and the depth to be inserted into the semiconductor substrate 330 to be described later may be adjusted. Both ends of the feeding pillar 320-1 may be designed in various shapes such as a T-shape, a circle, a square, and a triangle.

The feeding pillar 320-1 of the signal converting unit 320 connected to the input/output signal line 310-1 of the RF transceiving unit 310 may be inserted into the semiconductor substrate 330 so as not to be short-circuited with the upper waveguide metal 340. In order to insert the feeding pillar 320-1, a via hole may be formed in the semiconductor substrate 330 using a process such as a trench process or a dry etching process of a semiconductor process, and the feeding pillar 320-1 may be formed by depositing a dielectric and a metal. In addition, it may be formed by various processes such as mechanical etching and atomic layer deposition process.

Meanwhile, when the input/output signal line 310-1 of the RF transceiving unit 310 is inserted into the semiconductor substrate 330, the input/output signal line 310-1 may be inserted into the semiconductor substrate 330 directly in contact with a semiconductor medium. Alternatively, the input/output signal line 310-1 of the RF transceiving unit 310 and the feeding pillar 320-1 of the signal converting unit 320 connected thereto may be indirectly connected to the semiconductor substrate 330 with a dielectric layer interposed therebetween.

When the dielectric layer is used, matching may be adjusted by changing a permittivity and a thickness of the dielectric for the impedance matching among the input/output signal line 310-1, the feeding pillar 320-1, and the semiconductor substrate 330. In this case, in order to minimize a loss in the signal converting unit 320 and minimize a loss of a wave signal incident on the semiconductor substrate 330, different metal layers may be used for the input/output signal line 310-1 of the RF transceiving unit 310 and the upper waveguide metal 340.

The traveling wave antenna unit 370 including the semiconductor substrate 330, and the upper waveguide metal 340 and the lower waveguide metal 350 surrounding the semiconductor substrate 330 may radiate the RF signal converted into a wave signal (referred to as a 'channel radiation signal') by the feeding pillar 320-1 of the signal converting unit 320 through the semiconductor substrate 330 surrounded by the upper and lower waveguide metal 340 and 350. A semiconductor material such as silicon may be used as a material of the semiconductor substrate. However, the material of the semiconductor substrate is not limited thereto, and any semiconductor material may be used.

The semiconductor high frequency beamforming antenna according to an exemplary embodiment of the present disclosure adopts a semiconductor-based traveling wave structure, and transmits an input RF signal converted into a wave signal through the semiconductor substrate 330 surrounded by the upper and lower waveguide metal as a medium, so that the RF signal can be radiated through a radio channel while minimizing the loss in the semiconductor substrate 330.

Also, through such the structure, the semiconductor high frequency beamforming antenna can be fabricated in form of a small size phased array antenna, and can improve the complex matching network and high insertion loss characteristics. In this case, the thickness of the semiconductor substrate 330 may be adjusted to control the characteristic impedance of the antenna and to optimize the characteristics of the traveling wave antenna.

In addition, deposition of the upper and lower waveguide metal, which surround the semiconductor substrate 330, may be performed through a deposition using a semiconductor process, a method using a parallel plate formed on a printed circuit board (PCB) substrate, a method using a metal layer such as a transmission line, or the like. The upper and lower waveguide metal according to an exemplary embodiment of the present disclosure may be deposited in a separate form. Alternatively, two metal waveguides may be connected and used in the same potential state.

For example, the semiconductor reflector 360 may be implemented using a P-I-N diode. Alternatively, it may be implemented using an element such as a varactor. A specific beam may be radiated (output) in a desired direction in accordance with ON/OFF of the diode in the semiconductor reflector 360. That is, a radiation pattern of the antenna can be controlled.

The semiconductor reflector 360 according to an exemplary embodiment of the present disclosure may be disposed in a vertical or horizontal direction at the upper waveguide metal. A power source applied to the diode constituting the semiconductor reflector 360 may use metal of a layer different from that of the waveguide metal to minimize inter-signal interference and loss. Also, the position and shape of the diode in the semiconductor reflector 360 may be adjusted to maximize the maximum reflection efficiency and the constructive interference with the existing signal in the travelling wave antenna unit 370.

On the other hand, the semiconductor high frequency beamforming antenna according to an exemplary embodiment of the present disclosure may be used as a single directional antenna by using a pre-formed metal as a reflector without steering a beam direction.

Specifically, the semiconductor reflector in form of a diode array may be disposed in the semiconductor substrate 330 in the vertical direction to form a conductive reflective wall, wherein the wave signal in the semiconductor substrate 330 may be excited to the semiconductor substrate through a lower open window. This semiconductor structure may lead to an intended reconstruction beamforming.

When the diode of the semiconductor reflector 360 is turned on through a bias voltage, the semiconductor reflector 360 may act as a conductive reflective wall reflecting the incident wave in the opposite direction. Conversely, when the diode of the semiconductor reflector is turned off, electrical conductivity as low as the semiconductor substrate may not affect propagation of the wave signal.

The diode of the semiconductor reflector according to an exemplary embodiment of the present disclosure may be formed by a parallel connection of small diodes divided into a plurality of sub-blocks instead of a single diode. Since electrically-adjacent arrangements of conductive fences parallel to an electric field vector can create a strong reflective wall such as a conductor plate, the parallel connection may reduce power consumption of the diodes (or, diode array) while maintaining efficient wave reflection performance.

Meanwhile, the semiconductor high frequency beamforming antenna according to an exemplary embodiment of the present disclosure may include an antenna radiator (not shown) for beam gain control. The antenna radiator according to an exemplary embodiment of the present disclosure may be implemented in a meander line shape or a horn shape on the semiconductor substrate 330, the upper waveguide metal, and/or the lower waveguide metal. Alternatively, the antenna radiator may be mounted outside the semiconductor substrate 330 in a hybrid form.

The antenna radiator in the meander line shape may be implemented by depositing various metals in parallel to increase antenna gain. Also, an additional impedance matching part may be used to connect the antenna radiator according to an exemplary embodiment of the present disclosure to the waveguide metal. Hereinafter, a semiconductor high frequency beamforming antenna according to another exemplary embodiment of the present disclosure will be described.

Figure 4:
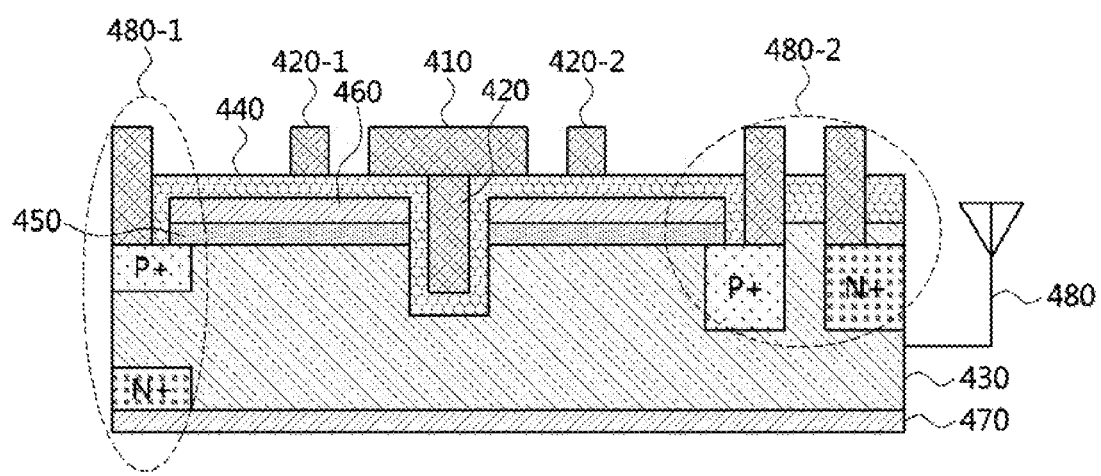
FIG. 4 is a conceptual diagram illustrating a semiconductor high frequency beamforming antenna according to another exemplary embodiment of the present disclosure.

FIG. 4 is a conceptual diagram illustrating a semiconductor high frequency beamforming antenna according to another exemplary embodiment of the present disclosure.

Referring to FIG. 4, a semiconductor high frequency beamforming antenna having a structure, in which the semiconductor reflectors 480-1 and 480-2 using a plurality of diodes are disposed in the semiconductor substrate 430, and the input/output signal line 410 of the RF transceiving unit using the dielectric layer 440 and the feeding pillar 420 of the signal converting unit are separated from the semiconductor substrate 430, is illustrated.

As described above, one or more ground (GND) lines 420-1 and 420-2 may be disposed around the input/output signal line of the RF transceiving unit 410 to improve the noise figure and quality of the RF signal.

In addition, the input/output signal line of the RF transceiving unit may be inserted into the semiconductor substrate with the dielectric layer 440 (which may be referred to as a 'first dielectric layer') therebetween, so that the input/output signal line of the RF transceiving unit 410 and the feeding pillar of the signal converting unit 420 connected thereto may be indirectly connected to the semiconductor substrate 430.

In case that the dielectric layer is used, the matching may be adjusted by changing the permittivity and the thickness of the dielectric for the impedance matching among the input/output signal line 410, the feeding pillar 420, and the semiconductor substrate 430 as described above. Also, in order to minimize the loss in the feeding pillar 420 of the signal converting unit and the loss of the wave signal incident on the semiconductor substrate 430, different metal layers may be used for the input/output signal line 410 of the RF transceiving unit and the upper waveguide metal 460. Further, a dielectric layer 450 (which may be referred to as a 'second dielectric layer') may be disposed between the upper waveguide metal 460 and the semiconductor substrate 430.

Referring to FIG. 4, the semiconductor high frequency beamforming antenna according to another exemplary embodiment of the present disclosure may include one or more semiconductor reflectors 480-1 and 480-2 arranged in a horizontal or vertical direction in the semiconductor substrate 430 to enable beam steering. Each of the semiconductor reflectors 480-1 and 480-2 according to an exemplary embodiment of the present disclosure may be implemented as including a single diode or a diode array.

Depending on ON/FF of the diode(s) in the semiconductor reflectors, a specific beam may be radiated (output) in the desired direction. The semiconductor reflector may include a diode bias metal at a P region or an N region. Hereinafter, a structure of a semiconductor high frequency beamforming antenna to which an antenna radiator according to another exemplary embodiment of the present disclosure is applied will be described.

Figure 5:
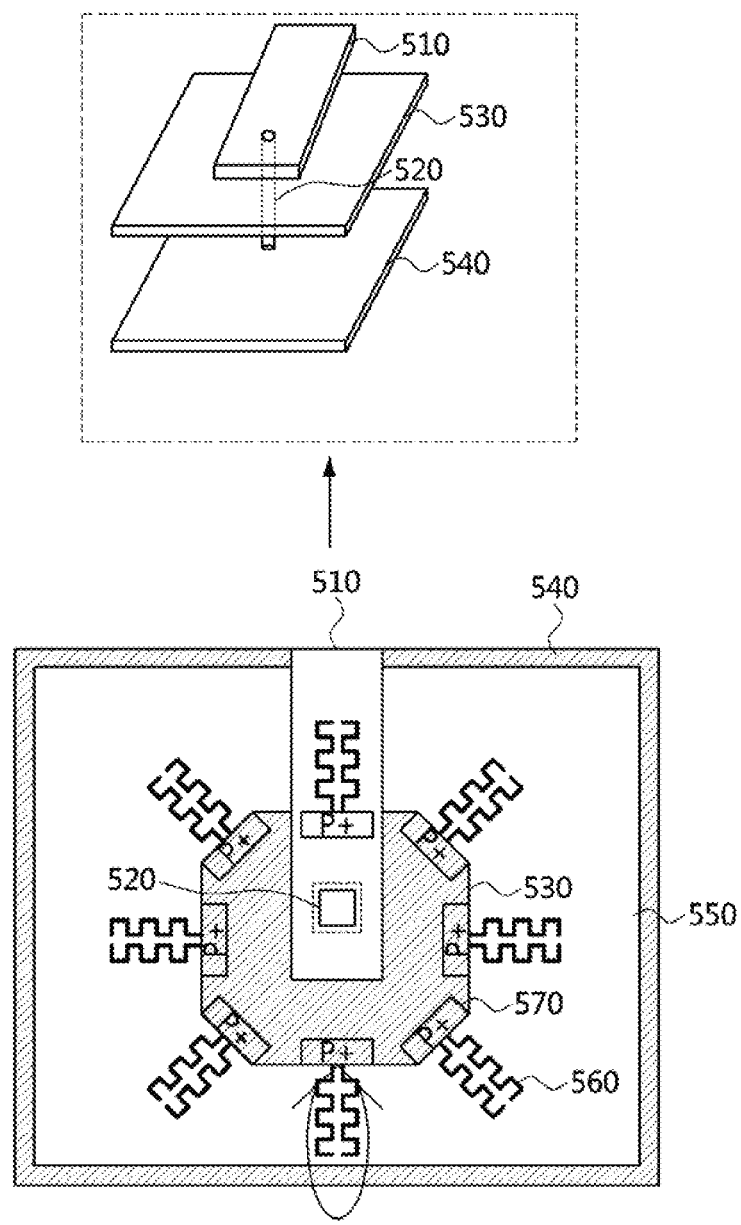
FIG. 5 is a conceptual diagram illustrating a semiconductor high frequency beamforming antenna to which an antenna radiator according to another exemplary embodiment of the present disclosure is applied.

FIG. 5 is a conceptual diagram illustrating a semiconductor high frequency beamforming antenna to which an antenna radiator according to another exemplary embodiment of the present disclosure is applied.

Referring to FIG. 5, a semiconductor high frequency beamforming antenna according to still another exemplary embodiment of the present invention, in which a plurality of antenna radiators 560 for controlling gain amplification of a beam output from a traveling wave antenna are disposed near the semiconductor reflector 570, is illustrated.

As described above, one or more semiconductor reflectors 570 may be disposed in a vertical or horizontal direction in the direction of the upper waveguide metal 530 and in a vertical or horizontal direction of the input/output signal line 510 of the RF transceiving unit connected to the feeding pillar 520. In the present embodiment, 8 semiconductor reflectors are arranged. The arrangement directions and the number of the semiconductor reflectors 570 and the arrangement directions and the number of the antenna radiators 560 are not limited thereto, and the arrangement directions and the number of them may be changed according to an installation environment.

Also, the antenna radiator 560 according to still another exemplary embodiment of the present disclosure may be implemented in a meander line shape or a horn shape on the upper and lower waveguide metal 530 and 540 surrounding the semiconductor substrate 550, or inside the semiconductor substrate 550. Alternatively, the antenna radiator may be mounted outside the semiconductor substrate 550 in a hybrid form. Hereinafter, a signal transmitting/receiving method using a semiconductor high frequency beamforming antenna according to an exemplary embodiment of the present disclosure will be described.

Figure 6:
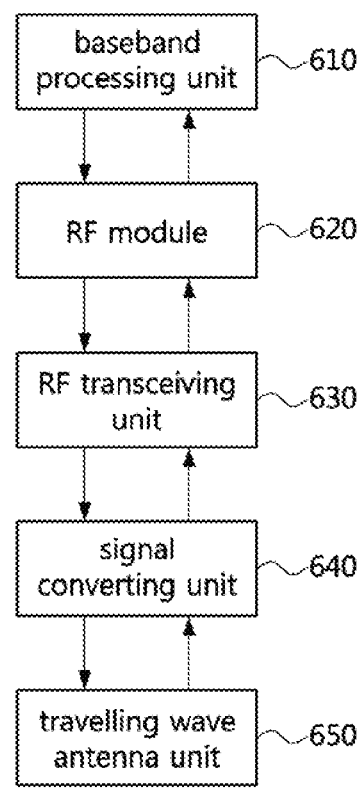
FIG. 6 is a block diagram illustrating a semiconductor high frequency beamforming antenna for transmitting and receiving signals according to an exemplary embodiment of the present disclosure.

FIG. 6 is a block diagram illustrating a semiconductor high frequency beamforming antenna for transmitting and receiving signals according to an exemplary embodiment of the present disclosure.

Referring to FIG. 6, a semiconductor antenna according to an exemplary embodiment of the present disclosure may comprise an RF transceiving unit 630, a signal converting unit 640, and a traveling wave antenna unit 650, which are integrated-circuitized. The semiconductor high frequency beamforming antenna according to an exemplary embodiment of the present disclosure may be integrated circuitized excluding some components or may be integrated circuitized including a baseband processing unit 610 and/or an RF module 620.

A baseband signal processed in the baseband processing unit 610 may be transmitted to the RF module 620 so as to be an RF signal. As described above, the RF module 620 may perform functions of a filtering unit, an amplifier unit including a low noise amplifier (LNA), an antenna switching unit, a frequency oscillation circuit unit, and an RF integrated chip (IC) processing high frequency analog signals, and the like.

The RF signal may be transmitted to the RF transceiving unit 630, and then may be transmitted to the signal converting unit 640 through an input/output signal line of the RF transceiving unit 630. The RF signal transmitted to the signal converting unit 640 may be converted into a wave signal through a feeding pillar of the signal converter 640 and then transferred to the traveling wave antenna unit 650. The traveling wave antenna unit 650 may include a semiconductor substrate, waveguide metal surrounding upper and/or lower surfaces of the semiconductor substrate, one or more semiconductor reflectors, and one or more antenna radiators.

The traveling wave antenna unit 650 may amplify the wave signal transmitted from the signal converting unit 640 when necessary, and control an output direction of the wave signal using the one or more semiconductor reflectors.

Meanwhile, the traveling wave antenna unit 650 receiving a signal through a radio channel under control of the semiconductor reflector may transmit the received signal to the feeding pillar of the signal converting unit 640 through the internal semiconductor substrate in form of a wave signal. The wave signal transmitted to the feeding pillar of the signal converting unit 640 may be transmitted to the RF module 620 through the input/output signal line of the RF transceiving unit 630, may be subjected to low noise amplification processing and the like, and may be transmitted to the baseband processing unit 610.

The embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for the present disclosure or can be publicly known and available to those who are skilled in the field of computer software.

Examples of the computer readable medium may include a hardware device such as ROM, RAM, and flash memory, which are specifically configured to store and execute the program instructions. Examples of the program instructions include machine codes made by, for example, a compiler, as well as high-level language codes executable by a computer, using an interpreter. The above exemplary hardware device can be configured to operate as at least one software module in order to perform the embodiments of the present disclosure, and vice versa.

While the embodiments of the present disclosure and their advantages have been described in detail, it should be understood that various changes, substitutions and alterations may be made herein without departing from the scope of the present disclosure.

What is claimed is:

1. A method for transmitting signals using a high frequency based integrated circuit beamforming antenna, the method comprising:
    transferring an output signal of a radio frequency (RF) module to an RF transceiving unit;
    transferring an output signal of the RF transceiving unit to a signal converting unit including a feeding pillar; and
    transferring a wave signal from the signal converting unit to a traveling wave antenna unit,
    wherein the feeding pillar converts the output signal of the RF transceiving unit to the wave signal,
    wherein the travelling wave antenna unit includes at least one of a semiconductor substrate, an upper waveguide metal, and a lower waveguide metal, and
    wherein the semiconductor substrate is directly connected to the feeding pillar of the signal converting unit or connected to the feeding pillar of the signal converting unit through at least one dielectric layer.

2. The method according to claim 1, wherein the RF transceiving unit includes at least one of an input/output signal line and a ground (GND) part.

3. The method according to claim 1, wherein the travelling wave antenna unit further includes at least one semiconductor reflector for steering an output beam.

4. The method according to claim 1, wherein the travelling wave antenna unit further includes an antenna radiator for controlling an output gain of an output beam.

5. A method for receiving signals using a high frequency based integrated circuit beamforming antenna, the method comprising:
    transferring a signal received using a traveling wave antenna unit to a signal converting unit in form of a wave signal; and
    transferring the wave signal to a radio frequency (RF) transceiving unit through a feeding pillar included in the signal converting unit,
    wherein the feeding pillar converts the output signal of the RF transceiver to the wave signal,
    wherein the travelling wave antenna unit includes at least one of a semiconductor substrate, an upper waveguide metal, and a lower waveguide metal, and
    wherein the semiconductor substrate is directly connected to the feeding pillar of the signal converting unit or connected to the feeding pillar of the signal converting unit through at least one dielectric layer.

6. The method according to claim 5, further comprising transferring an RF signal output from the RF transceiving unit to an RF module.

7. The method according to claim 5, wherein the RF transceiving unit includes at least one of an input/output signal line and a ground (GND) part.

8. The method according to claim 5, wherein the travelling wave antenna unit further includes at least one semiconductor reflector for steering an output beam.

9. The method according to claim 5, wherein the travelling wave antenna unit further includes an antenna radiator for controlling an output gain of an output beam.

10. A high frequency based integrated circuit beamforming antenna comprising:
    a radio frequency (RF) transceiving unit including at least one of an input/output signal line and a ground (GND) part;
    a signal converting unit including a feeding pillar; and
    a travelling wave antenna unit including a semiconductor substrate,
    wherein the feeding pillar converts the output signal of the RF transceiver to the wave signal,
    wherein waveguide metal layers are deposited on both an upper surface and a lower surface of the semiconductor substrate, and
    wherein the travelling wave antenna unit further includes at least one semiconductor reflector for steering an output beam.

11. The high frequency based integrated circuit beamforming antenna according to claim 10, wherein the semiconductor substrate is directly connected to the feeding pillar of the signal converting unit or connected to the feeding pillar of the signal converting unit through at least one dielectric layer.

12. The high frequency based integrated circuit beamforming antenna according to claim 10, wherein the at least one semiconductor reflector is a diode reflector.

13. The high frequency based integrated circuit beamforming antenna according to claim 10, wherein a metal of a power source of the semiconductor reflector is different from a metal of the metal waveguide layers.

14. The high frequency based integrated circuit beamforming antenna according to claim 10, wherein the travelling wave antenna unit further includes an antenna radiator for controlling an output gain of an output beam.

* * * * *